(12) United States Patent  
Komaili et al.

(10) Patent No.: US 8,374,297 B2
(45) Date of Patent: Feb. 12, 2013

(54) CIRCUIT, CONTROLLER AND METHODS FOR DYNAMIC ESTIMATION AND CANCELLATION OF PHASE AND GAIN IMBALANCES IN QUADRATURE SIGNAL PATHS OF A RECEIVER

(75) Inventors: Jaleh Komaili, Irvine, CA (US); Thomas Obkircher, Tustin, CA (US); William J. Domino, Yorba Linda, CA (US)

(73) Assignee: Intel Corporation, Santa Clara, CA (US)

( * ) Notice: Subject to any disclaimer, the term of this patent is extended or adjusted under 35 U.S.C. 154(b) by 1185 days.

(21) Appl. No.: 12/210,229

(22) Filed: Sep. 15, 2008

(65) Prior Publication Data

US 2010/0067622 A1    Mar. 18, 2010

(51) Int. Cl.
*H03D 1/04* (2006.01)
*H03D 1/06* (2006.01)
(52) U.S. Cl. ........ 375/346; 325/316; 327/310; 327/384; 327/551; 455/296
(58) Field of Classification Search .................... 375/346
See application file for complete search history.

(56) References Cited

U.S. PATENT DOCUMENTS

| 6,792,054 B1 * | 9/2004 | Bitran et al. | 375/343 |
| 7,782,235 B1 * | 8/2010 | Velazquez | 341/118 |
| 2008/0181334 A1 * | 7/2008 | Okuni et al. | 375/319 |
| 2011/0260898 A1 * | 10/2011 | Velazquez | 341/110 |

* cited by examiner

*Primary Examiner* — Erin File
(74) *Attorney, Agent, or Firm* — Forefront IP Lawgroup, PLLC

(57) ABSTRACT

A controller and a circuit work together to enable a selective and dynamic adjustment to correct phase and gain imbalances in quadrature signal paths of a receiver. Under select conditions, it has been determined that statistical estimates of gain and phase imbalance can be applied to adjust signals in the quadrature signal paths of a receiver. The controller validates the select conditions before updating the estimate of the gain imbalance and the estimate of the phase imbalance. The controller directs a compensator under select operating conditions such that validated dynamic estimates of the gain and phase imbalance or calibration data is applied to the quadrature signal paths. The controller disables the compensator and enables an estimator and a calculator when estimates are unavailable for the present operating conditions.

8 Claims, 9 Drawing Sheets

CIRCUIT, CONTROLLER AND METHODS FOR DYNAMIC ESTIMATION AND CANCELLATION OF PHASE AND GAIN IMBALANCES IN QUADRATURE SIGNAL PATHS OF A RECEIVER

BACKGROUND

Radio frequency (RF) transceivers are found in many one-way and two-way communication devices, such as portable communication devices, (cellular telephones), personal digital assistants (PDAs) and other communication devices. A RF transceiver transmits and receives signals using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband time-division multiple access (TDMA), a Gaussian minimum shift keying (GMSK) modulation scheme is used to communicate data.

The deployment of new wireless systems presents unique challenges to mobile handset designers. In order to reap the full benefit of expanded capacity and increased data bandwidth, the new handsets must work on both the new systems as well as the old. One of these new systems has been named Enhanced Data Rates for GSM Evolution (EDGE). The EDGE standard is an extension of the Global System for Mobile Communications (GSM) standard.

Conventional GSM/EDGE receiver architectures use a pair of circuits driven by mixers to separate components of the received signal. Generally, sine and cosine components of the received carrier signal are applied to mixers to extract the separate components. This "mixing" of the carrier signal produces what is referred to as in-phase or "I" signal component and a quadrature phase or "Q" signal component. These I and Q signal components are filtered and gain adjusted and finally sent to a baseband digital signal processor to extract the communicated data.

In recent years, GSM/EDGE receiver architectures have included very low intermediate frequency (VLIF) designs to avoid dealing with DC cancellation and second order input intercept point requirements for direct conversion receivers. A VLIF receiver architecture requires a relatively smaller integrated circuit footprint than the footprint for a direct conversion receiver due to the higher proportion of digital circuits and more relaxed analog filtering requirements. In addition, demodulation to baseband is performed in the digital domain. Therefore, for smaller complementary metal-oxide semiconductor (CMOS) geometries, a VLIF receiver architecture is attractive to receiver designers.

However, mismatch in the I and the Q signal paths due to imperfect mixers and anti-aliasing filters results in phase and gain imbalances between the I and Q signal paths. In addition, I and Q signal gain and phase errors result from frequency dependent variations in channel filters and various elements in the I and Q signal paths.

Prior art approaches to reduce gain and phase error variations include the design, selection and application of closely matched circuit elements in the I and Q signal paths as well as the performance of factory calibrations to determine gain and phase errors over various expected conditions. Both approaches have a significant impact on the cost of the transceiver and may not adequately address the phase and gain imbalances. The first approach increases the cost of procuring matched circuit elements with tight tolerances. The second or calibration approach increases the cost of procuring additional memory capacity to accommodate the range of possible gain and phase imbalances and the cost associated with testing and confirming adequate operation over a broad range of operating conditions.

SUMMARY

A circuit, controller and methods for dynamically and selectively estimating and correcting gain and phase imbalances in quadrature paths of a receiver are invented and disclosed. The controller statistically estimates gain and phase imbalance in the I and Q data of the receiver. The controller validates the estimated imbalances as well as the application of the imbalances to the received I and Q data to enhance receiver performance dynamically. The controller applies a set of rules based on the particular communication standard used by the receiver. The set of rules implementing the validation process may vary with the semiconductor process used in manufacturing the controller and other elements of the receiver.

An embodiment of a controller includes a first comparator configured to receive an indication of data signal length and a first threshold value, the first comparator configured to determine when the data signal length exceeds the first threshold value, a second comparator configured to receive an indication of signal strength and a second threshold value, the second comparator configured to determine when the signal strength exceeds the second threshold value, and a finite state machine configured to identify at least a frequency band of operation and a range of mixer gain, wherein when the data signal length exceeds the first threshold value and when the signal strength exceeds the second threshold value the controller stores an estimate of the gain imbalance and an estimate of the phase imbalance in quadrature signal paths of a receiver in accordance with the frequency band of operation and the range of mixer gain.

An embodiment of a circuit includes estimator, calculator and compensator portions, among other features. The estimator receives a first signal and a second signal and generates an auto correlation of data from the first signal, an autocorrelation of data from the second signal and a cross correlation of data from the first and second signals. A calculator receives the auto correlation of data from the first signal, the autocorrelation of data from the second signal and the cross correlation of data from the first and second signals and generates an estimate of the gain imbalance and an estimate of the phase imbalance. The compensator receives the estimate of the gain imbalance and the estimate of the phase imbalance and adjusts the phase imbalance by adding a portion of the second signal to the first signal. The compensator further adjusts the gain imbalance by applying the larger imbalance value to one of the I signal path and the Q signal path of a receiver.

An embodiment of method for dynamic estimation and cancellation of phase and gain imbalance in quadrature signal paths of a receiver includes the steps of removing any DC offset present in the quadrature signal paths, applying an initial gain compensation value and an initial phase compensation value, generating an estimate of gain imbalance and an estimate of phase imbalance present between the quadrature signal paths, generating a modified gain compensation value as a function of the estimate of the gain imbalance and the initial gain compensation value, generating a modified phase compensation value as a function of the estimate of the phase imbalance and the initial phase compensation value and selectively applying the modified gain compensation and the modified phase compensation values in the quadrature signal paths of the receiver.

The figures and detailed description that follow are not exhaustive. The disclosed embodiments are illustrated and described to enable one of ordinary skill to make and use the circuit, controller and methods for dynamic estimation and cancellation of phase and gain imbalance in quadrature signal paths of a receiver. Other embodiments, features and advantages of the circuit, controller and methods will be or will become apparent to those skilled in the art upon examination of the following figures and detailed description. All such additional embodiments, features and advantages are within the scope of the disclosed controller and methods as defined in the accompanying claims.

BRIEF DESCRIPTION OF THE FIGURES

The circuit, controller and methods for dynamically and selectively estimating and correcting gain and phase imbalances in quadrature paths of a receiver can be better understood with reference to the following figures. The components within the figures are not necessarily to scale, emphasis instead being placed upon clearly illustrating the principles and operation of the circuit, controller and methods. Moreover, in the figures, like reference numerals designate corresponding parts throughout the different views.

DETAILED DESCRIPTION

Figure 1:
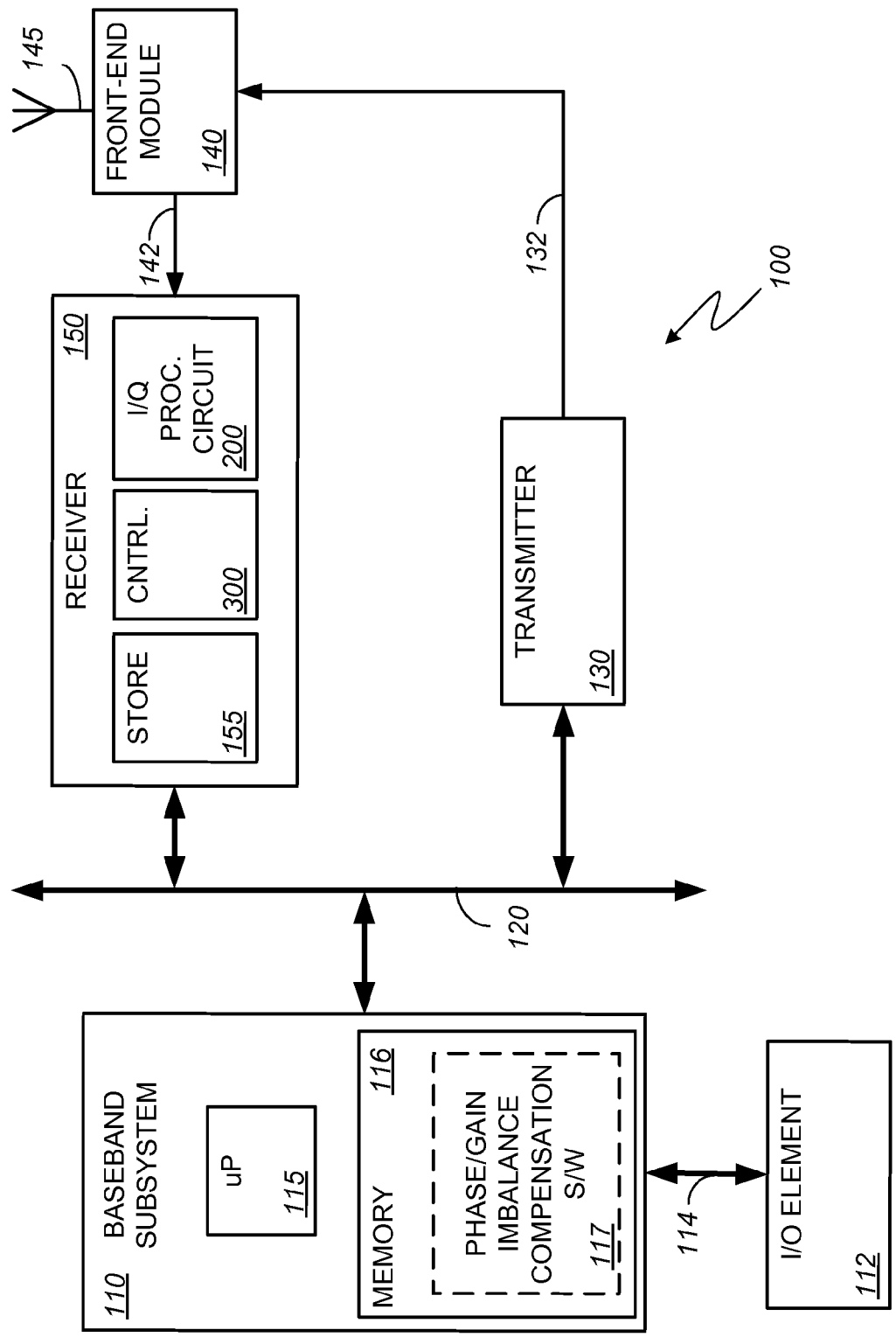
FIG. 1 is a block diagram illustrating a simplified portable transceiver including a signal processor.

While mismatches in analog circuitry can be reduced through design, circuit layout and careful selection of circuit elements, it has been discovered that, depending on the choice of the low intermediate frequency, mixing with adjacent blockers prior to demodulation in the baseband generates interferers in the receive channel that can degrade receiver performance. A signal processor or circuit estimates the gain and phase imbalances and corrects the same prior to demodulation.

A controller implementing a validation process applies information specific to the relevant communication standard being used by the receiver. Accordingly, the controller validation process includes communication system information and rules that together enable scenarios suitable to validate received data in the communication standard being used by the receiver. The example embodiments describe a controller and validation process suitable for validating received data in a receiver communicating under the GSM/EDGE standard. A different set of rules are applied by a data validating receiver using the WCDMA standard. Another set of rules would be applied by a data validating controller using the LTE communication standard. In addition, the controller validation process may vary in accordance with the particular semiconductor manufacturing process used to implement the circuit(s) and the controller. Moreover, the controller validation process may vary in accordance with algorithmic limitations. As equations 1 through 14 below describe statistical estimation and compensation of gain and phase imbalance in I and Q data for any communication standard, the controller is introduced to validate the estimated imbalances as well as the application of such estimates to the received data to enhance receiver performance dynamically.

Gain and phase imbalances are dependent on frequency and gain settings of various devices in the signal paths. A GSM receiver encounters at least two frequencies in a frame. A first frequency is associated with a first cell and a second frequency with a neighbor cell with generally different gain or signal power levels associated with each of the first cell and the neighbor cell. Generally receiver signal paths will include programmable low-noise amplifiers and power amplifiers. The combination of the first and second frequencies and a multitude of possible gain settings make dynamic compensation for gain and phase imbalances preferable over the time and expense of performing a thorough calibration across all combinations and storing the results with the transceiver. However, in light of the GSM system requirement for monitoring neighbor cells on different frequencies and bands requiring different gain settings in the same frame, in addition to frequency hopping requirements, it has been further discovered that estimation and adjustment of gain and phase in the I and Q signal paths should be applied selectively because under certain circumstances the algorithms for estimating phase and gain imbalances fail to converge.

A controller and a circuit work together to enable a selective and dynamic adjustment to correct phase and gain imbalances in the quadrature signal paths of a receiver. Under select conditions, it has been determined that statistical estimates of gain and phase imbalance can be applied to correct signals in the quadrature signal paths of a very low intermediate frequency GSM/EDGE receiver. The controller validates the select conditions before updating the estimate of the gain imbalance and the estimate of the phase imbalance. The controller directs a compensator under identified operating conditions to apply validated dynamic estimates of the gain and phase imbalances to adjust (i.e., correct) signals in the quadrature signal paths of a GSM/EDGE receiver. Alternatively, the compensator applies previously stored calibration data to correct phase and gain imbalances in the quadrature signal paths, when the estimates are not available and calibration data exists for the present operating conditions. The controller disables the compensator and enables an estimator and a calculator when estimates are unavailable for the present operating conditions.

The controller, circuit and methods for dynamically and selectively estimating and correcting gain and phase imbalances in quadrature paths of a receiver can be implemented in hardware, software, or a combination of hardware and software. When implemented in hardware, the controller, circuit and methods for dynamically and selectively estimating and correcting gain and phase imbalances in quadrature paths of a receiver can be implemented using specialized hardware elements and logic. When the controller, circuit and methods for dynamically and selectively estimating and correcting gain and phase imbalances in quadrature paths of a receiver is implemented partially in software, the software portion can be used to control components in the circuit so that various operating aspects can be software-controlled. The software can be stored in a memory and executed by a suitable instruction execution system (microprocessor). The hardware implementation of the controller, circuit and methods for dynamically and selectively estimating and correcting gain and phase imbalances in quadrature paths of a receiver can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the controller, circuit and methods for dynamically and selectively estimating and correcting gain and phase imbalances in quadrature paths of a receiver comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an I/Q signal processor circuit or circuit 200, a controller 300 and a data store 155 in a portable transceiver (e.g., a wireless handset). The portable transceiver 100 includes a baseband subsystem 110, an input/output (I/O) element 112, a transmitter 130, a front-end module 140, an antenna 145, and a receiver 150. The I/O element 112 is coupled to the baseband subsystem 110 via connection 114. The I/O element 112 represents any interface with which a user may interact with the portable transceiver 100. For example, the I/O element 112 may include a speaker, a display, a keyboard, a microphone, a trackball, a thumbwheel, or any other user-interface element. A power source (not shown), which may be a direct current (DC) battery or other power source, is also connected to the baseband subsystem 110 to provide power to the portable transceiver 100. In a particular embodiment, portable transceiver 100 can be, for example but not limited to, a portable telecommunication device such as a mobile cellular-type telephone.

The baseband subsystem 110 includes microprocessor (µP) 115 and memory 116. The microprocessor 115 and the memory 116 are in communication with each other. Depending on the manner in which the circuit 200, the controller 300 and methods for selective and dynamic adjustment to correct phase and gain imbalances in the quadrature signal paths of a receiver are implemented, the baseband subsystem 110 may also include one or more of an application specific integrated circuit (ASIC), a field programmable gate array (FPGA), or any other implementation-specific or general processor, among other devices.

The baseband subsystem 110, via microprocessor 115 and the memory 116, provides the signal timing, processing and I/O storage functions for portable transceiver 100. In addition, the baseband subsystem 110 generates various control signals, such as power control signals, filter control signals, and modulator control signals that are used to direct various functions within the transmitter 130 and the receiver 150, as known to those skilled in the art. The various control signals may originate from the microprocessor 115 or from any other processor within the baseband subsystem 110, and are supplied to a variety of connections within the transmitter 130 and the receiver 150. It should be noted that, for simplicity, only the basic components of the portable transceiver 100 are illustrated herein.

If portions of the circuit 200, controller 300 and methods for dynamically and selectively estimating and correcting gain and phase imbalances in quadrature paths of a receiver are implemented in software that is executed by the microprocessor 115, the memory 116 will also include phase/gain imbalance compensation software 117. The phase/gain imbalance compensation software 117 comprises one or more executable code segments that can be stored in the memory 116 and executed in the microprocessor 115.

Alternatively, the functionality of the phase/gain imbalance compensation software 117 can be coded into an ASIC (not shown) or can be executed by an FPGA (not shown), or another device. Because the memory 116 can be rewritable and because a FPGA is reprogrammable, updates to the phase/gain imbalance compensation software 117 can be remotely sent to and saved in the portable transceiver 100 when implemented using either of these methodologies.

In a preferred embodiment, the phase/gain imbalance compensation software 117 includes one or more executable code segments for configuring the baseband subsystem 110 to operate in conjunction with the store 155, circuit 200 and controller 300. Gain and phase compensation is more effective in the receiver 150 than in the baseband subsystem 110 for low IF receiver architectures. Accordingly, the circuit 200 and controller 300 operate at a low IF before the final down conversion to a baseband frequency.

The baseband subsystem 110 transforms digital communication information within baseband subsystem 110 into analog signals for transmission by the transmitter 130. More specifically, the baseband subsystem 110 uses digital-to-analog converters (not shown) to generate the in-phase (I) and quadrature-phase (Q) transmit signals that are applied via bus 120 to the transmitter 130.

The transmitter 130 includes a modulator (not shown), which modulates the analog signals and provides a modulated signal to an upconverter (not shown). The upconverter transforms the modulated signal on to an appropriate transmit frequency and provides the upconverted signal to a power amplifier (not shown). The power amplifier amplifies the upconverted signal to an appropriate power level for the communication protocol or standard in which the portable transceiver 100 is designed to operate. The modulated, upconverted and amplified transmit signal is forwarded to front-end module 140 via connection 132. Details of the transmitter 130 are not shown, as they will be understood by those skilled in the art. For example, when the power amplifier is used in a constant-amplitude, phase (or frequency) modulation application such as the global system for mobile communications (GSM) standard, the phase modulated information is provided by a modulator within the transmitter 130. When a power amplifier (not shown) is used in an application requiring both phase and amplitude modulation such as, for example, extended data rates for GSM evolution, referred to as EDGE, the Cartesian in-phase (I) and quadrature (Q) components contain both amplitude and phase information.

The front-end module 140 comprises an antenna system interface that may include, for example, a duplexer having a filter pair that allows simultaneous passage of both transmit signals and receive signals in respective frequency ranges, as known to those having ordinary skill in the art. The transmit signal is supplied from the front end module 140 to the antenna 145 for signal transmission to suitable configured communication devices remote from portable transceiver 100.

A signal received by an antenna 145 is directed from the front-end module 140 to the receiver 150 via connection 142. The receiver 150 includes various components to downconvert, digitize and filter a recovered data signal from a received signal, as known to those skilled in the art. A mixing stage downconverts and separates the received RF signal into in-phase (I) and quadrature-phase (Q) receive signals. The I and Q receive signals are sampled and transformed into digital signals by one or more analog-to-digital converters. One or more specialized digital filters are introduced to further process the I and Q receive signals. For example, a series combination of a cascaded integrator-comb (CIC) filter for downsampling the output of a possible delta sigma converter, a droop filter to correct for the droop resulting from the CIC filter and a DC-notch filter can process the I and Q receive signals before demodulation and further baseband signal processing. A CIC filter is an optimized finite-impulse response filter combined with an interpolator or decimator to filter multiple rate signals. A droop filter compensates for losses in a transmission path between the emitter and the receiver 150. A DC-notch filter removes any zero frequency or DC component that may be present in the I and Q signals.

Thereafter, but prior to demodulation, the I/Q signal processor or circuit 200 under the direction of the controller 300 and in cooperation with data store 155 are introduced to dynamically and selectively estimate and correct gain and phase imbalances in the I and Q (i.e., quadrature) signal paths of the receiver 150. After dynamic (i.e., controlled) correction for gain and phase imbalances, the corrected signals are demodulated and further processed in the baseband subsystem 110.

The transmitter 130 and the receiver 150 may be collocated in an integrated transceiver, such as when the transmitter 130 and the receiver 150 are implemented on a RF integrated circuit (IC). In alternative embodiments the receiver 150 and the transmitter 130 are implemented on separate ICs. Under both architectures, the circuit 200, controller 300 and data store 155 are preferably implemented in hardware on an integrated circuit in the receiver 150. The hardware integration enables the combination to be used for dynamic estimation and compensation of the gain and phase imbalances as well as for an initial on-chip calibration.

The statistical phase and gain imbalance estimation and compensation is as follows. For an ideal signal s and a received signal r with a phase imbalance of $\Phi_{IMB}$ and a gain imbalance of $\Gamma_{IMB}$, it can be shown $$r_i + j \cdot r_q = s_i + j \cdot (\Gamma_{IMB} \cdot e^{j\Phi_{IMB}}) \cdot s_q \quad \text{Equation 1}$$
$$= (s_i - \Gamma_{IMB} \cdot \sin(\Phi_{IMB}) \cdot s_q) +$$
$$j \cdot \Gamma_{IMB} \cdot \cos(\Phi_{IMB}) \cdot s_q$$
$$= I + j \cdot Q$$

Computing the auto and cross correlation for the I and Q channels with zero mean and unity variance, it can be further shown $$E(I^2) = 1 + \Gamma_{IMB}^2 \cdot \sin^2(\Phi_{IMB})$$
$$E(Q^2) = \Gamma_{IMB}^2 \cdot \cos^2(\Phi_{IMB}) \quad \text{Equation 2}$$
$$E(I \cdot Q) = -\Gamma_{IMB}^2 \cdot \cos(\Phi_{IMB}) \cdot \sin(\Phi_{IMB})$$

From Equation 2, entities φ and γ are defined that relate I and Q autocorrelation and cross correlation to gain and phase imbalance as shown in Equations 3 and 4 below.

$$\varphi = \frac{E(I \cdot Q)}{E(Q^2)} = -\tan(\Phi_{IMB}) \quad \text{Equation 3}$$

$$\gamma = \frac{E(I^2)}{E(Q^2)} = \tan^2(\Phi_{IMB}) + \frac{1 + \tan^2(\Phi_{IMB})}{\Gamma_{IMB}^2} \quad \text{Equation 4}$$

It can be further shown that for small phase imbalance values, $$\Phi_{IMB} = -\varphi, \text{ and} \quad \text{Equation 5}$$

$$\Gamma_{IMB} = \sqrt{\frac{1 + \varphi^2}{\gamma - \varphi}} \quad \text{Equation 6}$$

To correct for phase imbalance, a portion of the Q path signal ($-\varphi \cdot r_q$) is added to the I path signal, $r_i$ as indicated in Equation 7 below.

$$r_i + j \cdot r_q = s_i + j \cos(\Phi_{IMB}) \cdot s_q \quad \text{Equation 7}$$

Equation 7 shows that correcting the phase imbalance would inflict a small gain imbalance as a result of the cosine factor in the Q path. However, for small phase imbalance values, the gain imbalance is negligible.

Gain imbalance correction is applied to either the I or the Q path, in accordance with whichever has the larger imbalance value. The correction path may be kept the same after the first selection.

To demonstrate the capability of the algorithm, the algorithm was applied in a simulation modeling a GSM/EDGE receiver. MCS-5, an EDGE 8-PSK modulated signal per a 3GPP standard, was used. One decibel of gain imbalance and 3° of phase imbalance were added to the signal. The impaired signal was processed through a GSM receiver which could be implemented as shown in FIG. 1 with the gain and phase imbalance estimator and compensator implemented before demodulation. An alternate channel blocker, also 8-pSK modulated, was added to the signal. The simulation revealed that gain and phase imbalance can be estimated in two GSM slots or less. If the blocker is removed, or only a weak signal is present, the estimation algorithm does not converge. This is expected as Equation 3 and Equation 4 become computationally unstable as signal strength $E(Q^2)$ approaches zero. Therefore, a condition to prevent unstable behavior of the circuit 200 is the presence of a blocker or a large signal available as an input to the estimation algorithm.

In a low IF receiver architecture, the high performance image rejection becomes significant in the presence of blockers. Therefore, it is acceptable for the receiver 150 to disable the estimation process by setting a relatively high threshold for the input signal to allow estimation updates only in the presence of a large receive signal or a blocker.

Figure 2:
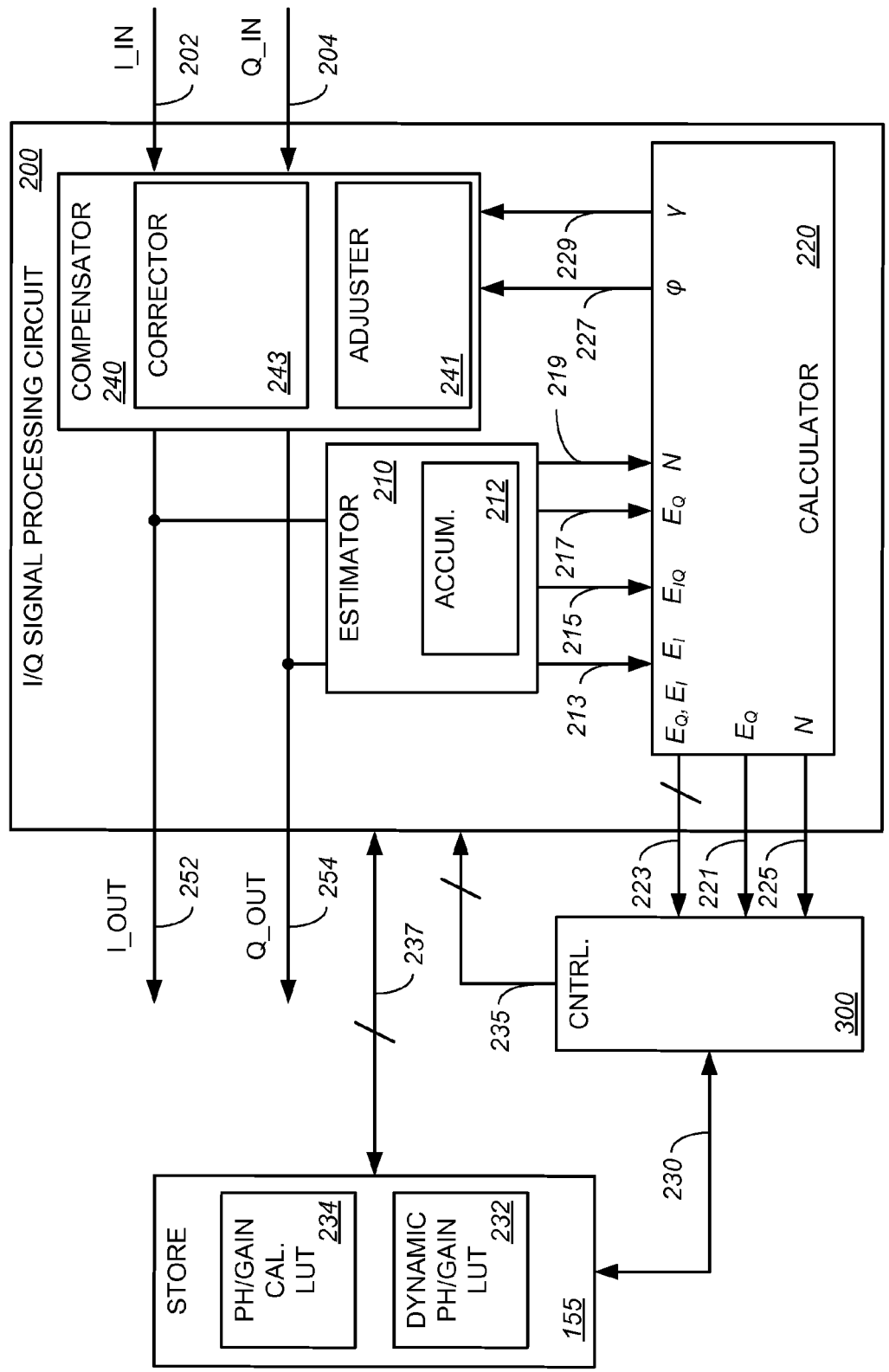
FIG. 2 is a functional block diagram illustrating an example embodiment of the signal processor or circuit of FIG. 1.

FIG. 2 is a functional block diagram illustrating an example embodiment of the I/Q signal processor or circuit 200 of FIG. 1. The circuit 200 includes an estimator 210, a calculator 220 and a compensator 240. The circuit 200 dynamically and selectively estimates and corrects gain and phase imbalances in quadrature paths of the receiver 150. The circuit 200 is coupled to a first connection 202 carrying an in-phase (I_IN) representation of a received signal. In addition, the circuit 200 is coupled to a second connection 204 carrying a quadrature phase (Q_IN) representation of the received signal. The connection 202, the compensator 240 and the connection 252 form a portion of a first or in-phase signal path. The connection, 204 the compensator 240 and the connection 254 form a portion of a second or quadrature phase signal path.

The circuit 200 operates under the direction of controller 300, which is coupled to the circuit 200 via a multiple channel connection 235. The circuit 200 is also configured to receive from and forward information to, data store 155 via multiple channel connection 237. In operation, the circuit 200 selectively applies a dynamic gain adjustment and a dynamic phase adjustment to the in-phase and quadrature phase signal paths. To correct for a phase imbalance, a portion of the quadrature signal is added to the in-phase signal. Gain imbalance correction is selectively applied to either of the in-phase signal path via connection 252 or the quadrature phase signal path via connection 254, whichever has a larger imbalance estimate value.

In the illustrated embodiment, the controller 300 and the data store 155 are separate elements. However, it should be understood that one or both of the controller 300 and the data store 155, or even portions of these elements, can be integrated with the circuit 200 as may be desired. As illustrated in FIG. 2, the data store 155 includes a dynamic phase/gain look up table 232 and a phase/gain calibration look up table 234. The dynamic phase/gain look up table 232 includes enough registers or storage locations to save a phase imbalance estimate and a gain imbalance estimate for at least each combination of a range of mixer gain and an operating frequency band. The phase/gain calibration look up table 234 may have a similar capacity. However, phase/gain calibration data may be limited to a subset of the combinations of the range of mixer gain and frequency bands available on the portable transceiver 100.

The estimator 210 is arranged to receive the I_OUT and Q_OUT signals via connection 252 and via connection 254, respectively. The estimator 210 is also coupled to the calculator 220 via connection 213, connection 215, connection 217 and connection 219.

The estimator 210 uses an accumulator 212 to provide an autocorrelation ($E_I$) of sampled values from the first quadrature signal path on connection 213. The accumulator 212 further provides an autocorrelation ($E_Q$) of sampled values from the second quadrature signal path on connection 217. The accumulator 212 provides a cross correlation ($E_{IQ}$) of sampled values from the first quadrature signal path and the second quadrature signal path on connection 215. In addition, the estimator 210 provides an indication of the number of samples that have contributed to the autocorrelation and cross correlation values on connection 219. The number of samples communicated by the estimator 210 reflects the number of samples under the present operating conditions in the receiver 150. The indication of the number of samples may be buffered before being communicated to the controller 300 via connection 225. In an alternative embodiment, the number of samples is simply passed from the calculator 220 to the controller 300.

The calculator 220 receives the first auto correlation value, the second auto correlation value and the cross correlation value via connection 213, connection 217 and connection 215, respectively. In turn, the calculator 220 generates an estimate of the phase imbalance ($\phi$) between I_OUT and Q_OUT and an estimate of the phase imbalance ($\gamma$) between I_OUT and Q_OUT. As illustrated in FIG. 2, the estimate of the phase imbalance is forwarded to the compensator 240 via connection 227 and the estimate of the gain imbalance is forwarded to the compensator 240 via connection 229. The autocorrelation of the sampled values ($E_Q$) from the second quadrature signal path is forwarded to the controller 300 on connection 221. In addition, the autocorrelation of the sampled values ($E_Q$) from the second quadrature signal path and/or the autocorrelation of the sampled values ($E_I$) is/are forwarded to the controller 300 on multiple channel connection 223. In an alternative embodiment, the calculator 220 is arranged to identify and forward an indication of the autocorrelation value with the greater magnitude to the compensator 240.

The compensator 240 includes an adjuster 241 and a corrector 243. Features and operation of the adjuster 241 and the corrector 243 will be described in detail in association with the embodiment illustrated in FIG. 4C.

Figure 3:
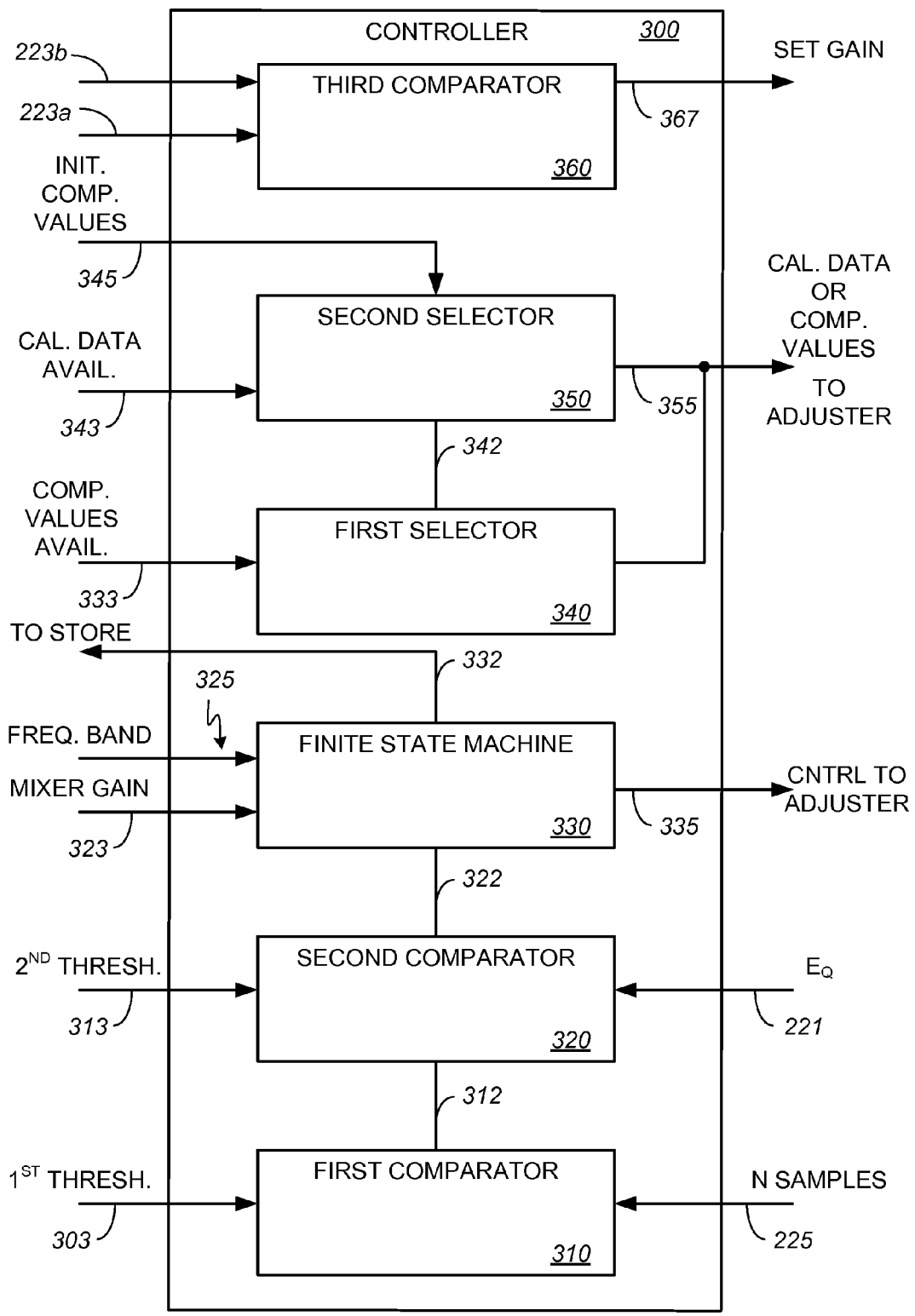
FIG. 3 is a functional block diagram illustrating an embodiment of the controller of FIG. 2.

FIG. 3 is a functional block diagram illustrating an embodiment of the controller 300 of FIG. 2. The controller 300 includes a first comparator 310, a second comparator 320, a finite state machine 330, a first selector 340, a second selector 350 and a third comparator 360. The first comparator 310 receives a first threshold value on connection 303 and an indication of the number of samples of the signals in the quadrature signal paths on connection 225. Connection 303 may originate in data store 155 or in other storage elements (e.g., a register) in the portable transceiver 100. When the number of samples on connection 225 exceeds the first threshold value on connection 303, the first comparator 310 initializes the second comparator 320 via a first initialization signal on connection 312.

The second comparator 320 receives a second threshold value on connection 313 and an indication of signal strength in the second quadrature signal path on connection 221. Connection 313 may originate in data store 155 or in other storage elements (e.g., a register) in the portable transceiver 100. When the signal strength on connection 221 exceeds the second threshold value received on connection 313, the second comparator 320 initializes the finite state machine 330 via a second initialization signal on connection 322.

The finite state machine 330 receives an indication of the present range of mixer gain being applied to the mixers used in generating the I_IN and Q_IN signals on connection 323 as well as an indication of the present frequency band of operation on connection 325. Connection 323 and connection 325 may originate in the baseband subsystem 110 (in the form of a command signal) or in the receiver 150 of the portable transceiver 100 (in the form of a telemetry signal). Depending on the number of different frequency bands and the number of mixer gain ranges in the receiver 150, the finite state machine 330 identifies a present operating state via a signal or signals on connection 332 and connection 335. As indicated in FIG. 3, the present operating state of the receiver 150 is communicated to the data store 155 via connection 322 to determine if estimates have been previously generated and stored for the present operating conditions. In response, the first selector 340 receives an indication on connection 333 when phase and gain compensation values have been previously stored in the data store for the present combination of frequency band and range of mixer gain. In addition, the present operating state of the receiver 150 is communicated to the adjuster 241.

As shown in FIG. 3, when phase and gain compensation values are available in the data store 155, the compensation values are forwarded to the adjuster 241 (FIG. 2) via connection 355. Otherwise, when the first selector 340 receives an indication on connection 333 that compensation values are not available in data store 155, the first selector 340 initializes the second selector 350 via a third initialization signal on connection 342. The second selector 350 receives an indication on connection 343 when calibration data is available in the data store 155. The second selector 350 further receives initial compensation values on connection 345. When calibration data is available, the second selector 350 forwards the calibration data to the adjuster 241 via connection 355. Otherwise, when no calibration data is available for the present operating condition, the second selector 350 forwards an initial phase compensation value and an initial gain compensation value via connection 355 to the adjuster 241.

The third comparator 360 receives an indication via connection 223a of the magnitude of the autocorrelation value from the portion of the receive signal in the first quadrature signal path and an indication via connection 223b of the magnitude of the autocorrelation value from the portion of the receive signal in the second quadrature signal path. In turn, the third comparator 360 determines which of the two input signals is greater in magnitude and forwards an indication of the same via connection 367 to the corrector 243.

The controller 300 illustrated in FIG. 3 is presented in a functional block diagram. It should be understood that the various comparators, selectors and the finite state machine shown within the controller 300 may be located throughout the receiver 150 and in some embodiments one or more of the comparators, the selectors or the finite state machine may be located in other portions of the portable transceiver 100.

Figure 4A:
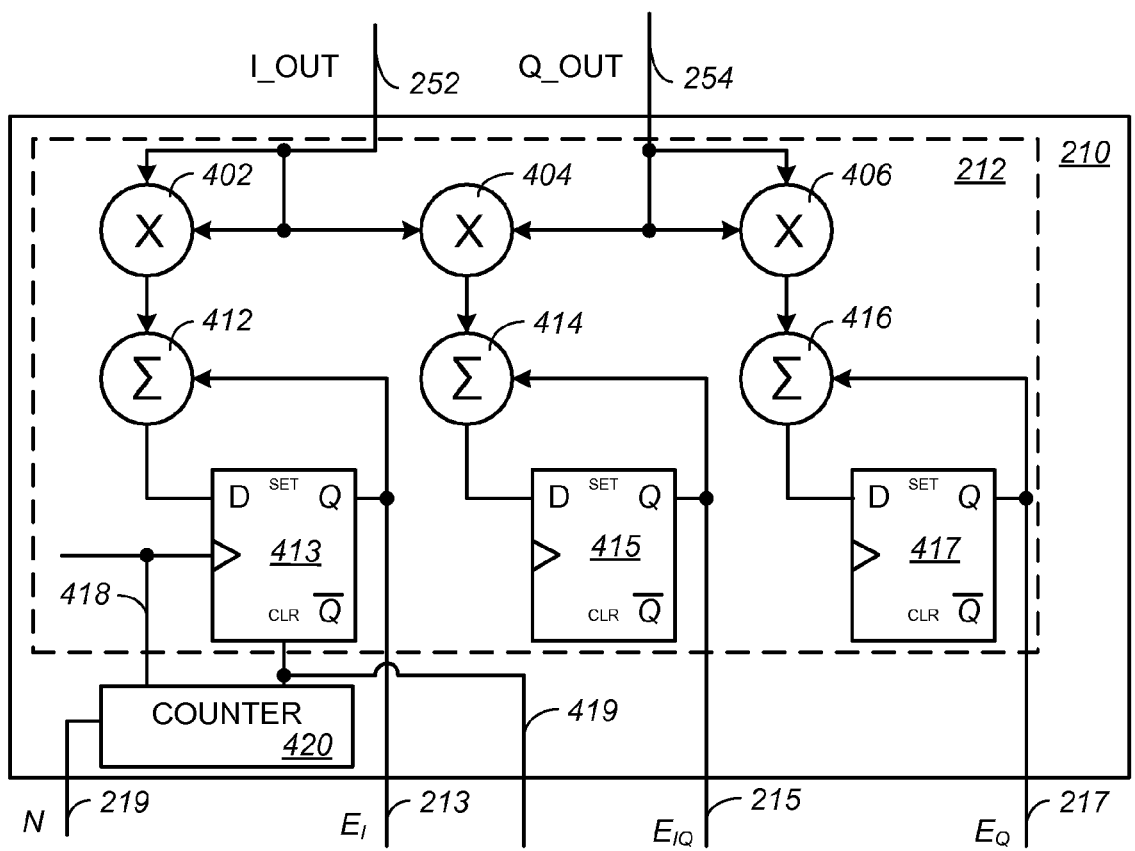
FIGS. 4A-4C are schematic diagrams illustrating embodiments of the estimator, the calculator and the compensator of the signal processor or circuit of FIG. 2.
Figure 4B:
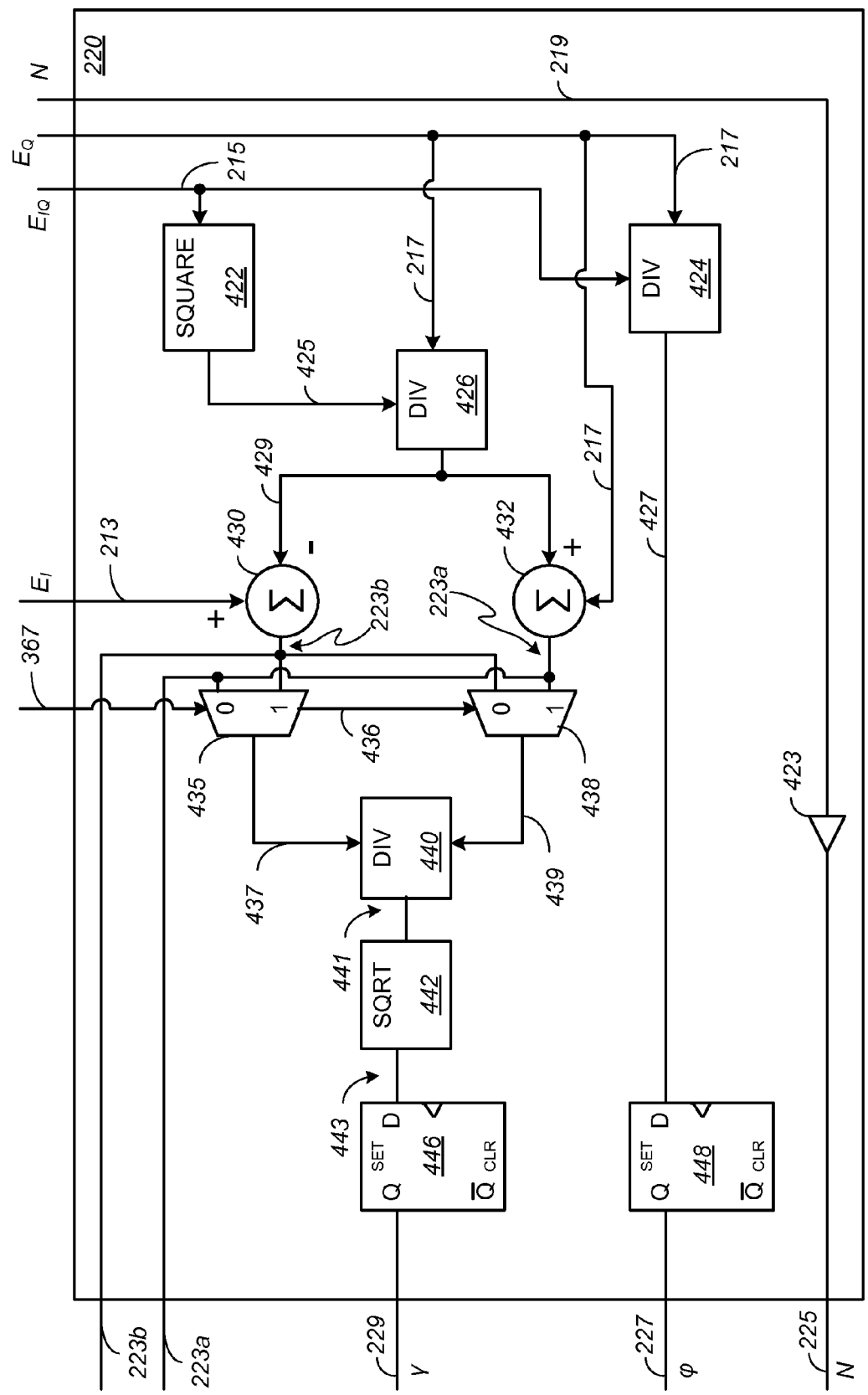
Figure 4C:
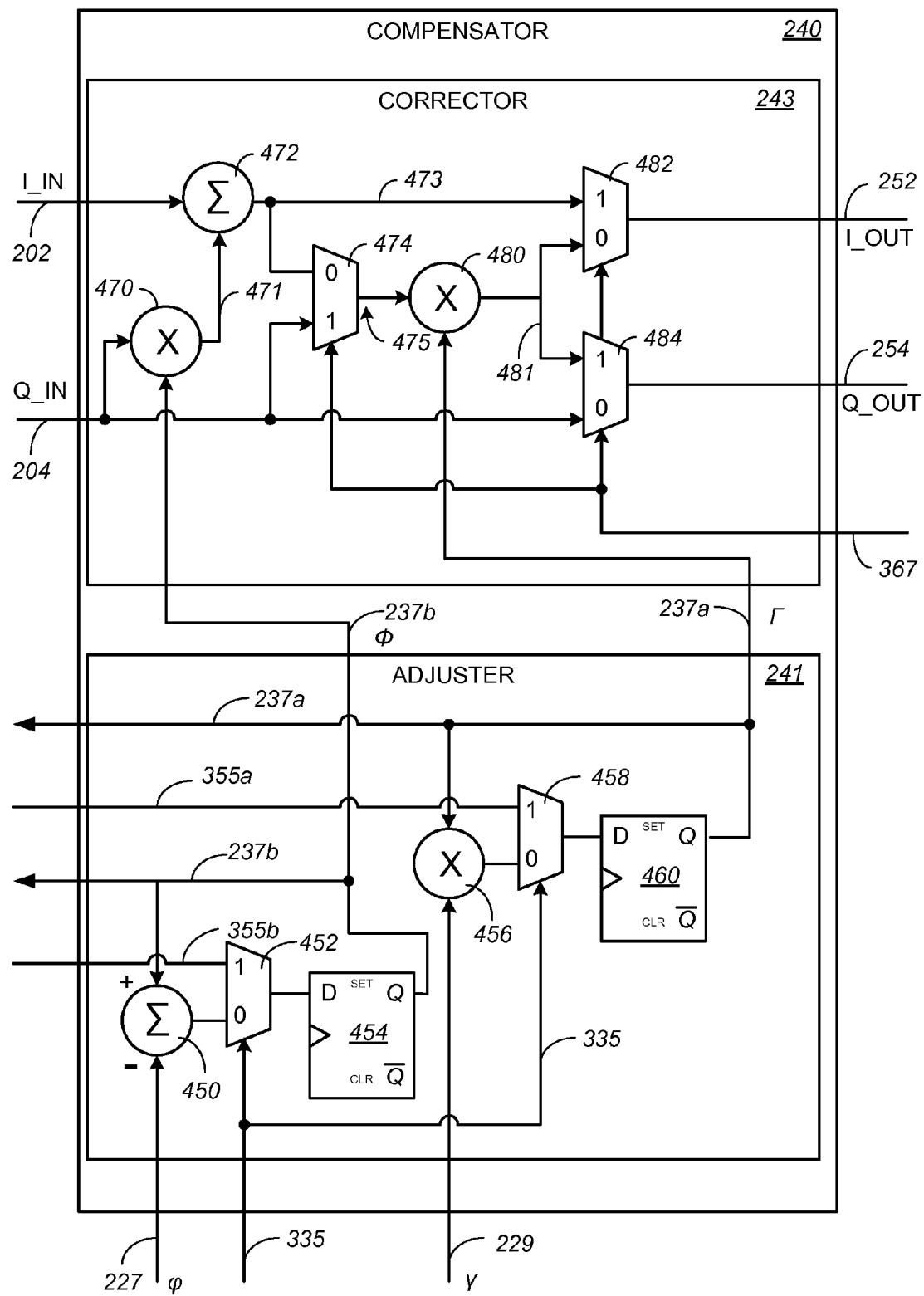

FIGS. 4A-4C are schematic diagrams illustrating embodiments of the estimator 210, the calculator 220 and the compensator 240 of the signal processor or circuit 200 of FIG. 2. As illustrated in FIG. 4A, the estimator 210 includes an accumulator 212 and a counter 420. In alternative embodiments, the estimator 210 may also include an input buffer for amplifying the I_OUT and Q_OUT signals prior to sampling and generating the estimates of the phase imbalance and the gain imbalance in the quadrature signal paths of the receiver 150.

The accumulator 212 includes three series combination of a multiplier, an adder and a flip-flop. For example, a first series arrangement includes a multiplier 402, an adder 412, and a flip-flop 413. The first series arrangement generates a sum of products as indicated in Equation 8.

$$E_I = \Sigma I_N \cdot I_N \qquad \text{Equation 8}$$

The multiplier 402 has two inputs both of which are coupled to connection 252 and a single output, which is coupled to a first input of the adder 412. The output of the adder 412 is coupled to the data input of the flip-flop 413. The Q output of the flip-flop 413 provides an auto correlation value ($E_I$) on connection 213, which is coupled to a second input of the adder 412 and to elements within the calculator 220. A second series arrangement includes a multiplier 406, an adder 416, and a flip-flop 417. The second series arrangement generates a sum of products as indicated in Equation 9.

$$E_Q = \Sigma Q_N \cdot Q_N \qquad \text{Equation 9}$$

The multiplier 406 has two inputs both of which are coupled to connection 254 and a single output, which is coupled to a first input of the adder 416. The output of the adder 416 is coupled to the data input of the flip-flop 417. The Q output of the flip-flop 417 provides an auto correlation value ($E_Q$) on connection 217, which is coupled to a second input of the adder 416 and to elements within the calculator 220. A third series arrangement includes a multiplier 404, an adder 414, and a flip-flop 415. The third series arrangement generates a sum of cross products as indicated in Equation 10.

$$E_{IQ} = \Sigma I_N \cdot Q_N \qquad \text{Equation 10}$$

The multiplier 404 has two inputs and a single output. The first input is coupled to connection 252. The second input is coupled to connection 254. The single output is coupled to a first input of the adder 414. The output of the adder 414 is coupled to the data input of the flip-flop 415. The Q output of the flip-flop 415 provides a cross correlation value ($E_{IQ}$) on connection 215, which is coupled to a second input of the adder 415 and to elements within the calculator 220.

A counter 420 receives a system clock on connection 418 and a reset signal on connection 419. The counter 420, operating in accordance with the system clock and reset signal, generates a representation of the number of samples used to generate the autocorrelation and the cross correlation values on connection 219.

As illustrated in FIG. 4B, the calculator 220 receives the autocorrelation values $E_I$ and $E_Q$ and the cross correlation value $E_{IQ}$ and generates an estimate of the gain imbalance γ and an estimate of the phase imbalance φ between the I_OUT and Q_OUT signals in the quadrature paths of the receiver 150. In the illustrated embodiment, the calculator 220 receives an indication of the number of samples N used in generating the auto correlation values and the cross correlation value on connection 219. Connection 219 is coupled to buffer 423 which amplifies the signal. Buffer 423 provides the amplified signal representing the number of samples on connection 225. In alternative embodiments, the number of samples N may be communicated to the controller 300 via other elements or mechanisms.

The calculator 220 includes a square element 422, a division element 424, a division element 426, a division element 440, a square root element 442 as well as a flip-flop 446 and a flip-flop 448. The calculator further includes a first adder 430, a second adder 432, a first multiplexer 435 and a second multiplexer 438.

The calculator 220 receives the auto correlation value generated from the samples of the Q_OUT signal $E_Q$ on connection 217. The connection 217 is coupled to the denominator inputs of the division element 426 and the division element 424. The calculator 220 receives the cross correlation value $E_{IQ}$ generated from the samples of the I_OUT and the Q_OUT signals on connection 215. The connection 215 is coupled to the numerator input of the division element 424 and the input to the square element 422. The output of the division element 424 ($E_{IQ}/E_Q$) is provided on connection 427 to the data input of the flip-flop 448. The Q output of the flip flop 448 is coupled to connection 227, which provides the estimate of the phase imbalance φ between the I_OUT and Q_OUT signals in the quadrature paths of the receiver 150. The estimate of the phase imbalance is generated as indicated in Equation 11 below.

$$\varphi = \frac{E_{IQ}}{E_Q}$$ Equation 11

The calculator 220 receives the auto correlation value generated from the samples of the I_OUT signal $E_I$ on connection 213. The connection 213 is coupled to the positive input of the first adder 430. The estimate of the gain imbalance γ is generated as a function of the cross correlation value $E_{IQ}$ and the auto correlation value generated from the samples of the I_OUT signal $E_I$. As indicated above, the cross correlation value is squared by the square element 422. The output of the square element 422 is provided on connection 425 to the numerator input of the division element 426. The division element 426 generates the ratio $E_{IQ}^2/E_Q$. The output of the division element 426 is provided on connection 429 to the negative input of the first adder 430 and to a first input of the adder 432. Accordingly, the first adder 430 generates the difference of $E_I$ and the ratio $E_{IQ}^2/E_Q$ and provides the result on connection 223b. The second adder 432 generates the sum of $E_Q$ and the ratio $E_{IQ}^2/E_Q$ and provides the result on connection 223a. The clock input of the first multiplexer 435 is coupled to connection 367. The clock input of the second multiplexer 438 is coupled to connection 436, which coordinates the first multiplexer 435 and the second multiplexer 438. The first multiplexer 435 forwards the difference of $E_I$ and the ratio $E_{IQ}^2/E_Q$ on connection 437 to the denominator input of the division element 440. The second multiplexer 438 forwards the sum of $E_Q$ and the ratio $E_{IQ}^2/E_Q$ on connection 439 to the numerator input of the division element 440. In turn, the division element 440 generates the ratio of $E_Q+E_{IQ}^2/E_Q/E_I-E_{IQ}^2/E_Q$ and forwards the same on connection 441 to the input of the square root element 442. The square root element 442 generates the square root of the ratio of $E_Q+E_{IQ}^2/E_Q/E_I-E_{IQ}^2/E_Q$ and forwards the same on connection 443 to the D input of the flip-flop 446. The Q output of the flip flop 446 is coupled to connection 229, which provides the estimate of the gain imbalance γ between the I_OUT and Q_OUT signals in the quadrature paths of the receiver 150. The estimate of the gain imbalance γ is generated as indicated in Equation 12 below.

$$\gamma = \sqrt{\frac{E_Q + \frac{E_{IQ}^2}{E_Q}}{E_I - \frac{E_{IQ}^2}{E_Q}}}$$ Equation 12

As indicated in FIG. 4C, the adjuster 241 receives the estimate of the phase imbalance φ on connection 227 and the estimate of the gain imbalance γ on connection 229. In addition, the adjuster 241 receives one of a previously stored gain compensation value or calibration data on connection 355a and one of a previously stored phase compensation value or calibration data on connection 355b. In accordance with a control signal on connection 335 from the controller 300, the adjuster 241 generates a modified phase compensation value Φ and a modified gain compensation value Γ. The modified phase compensation value Φ is a function of an initial phase compensation value and the estimate of the phase imbalance φ. The calibration data or a previously stored gain compensation value from data store 155 is received at a positive input of the adder 450 via connection 237b. The connection 227 applies the estimate of the phase imbalance φ to the negative input of the adder 450. The adder 450 provides the difference of the modified phase compensation value Φ and the estimate of the phase imbalance φ to a first input of the multiplexer 452. A second input of the multiplexer 452 is coupled to connection 355b, which provides one of the calibration data or a previously stored gain compensation value from the data store 155 to the second input of the multiplexer 452. The output of the multiplexer 452 is coupled to the data input of the flip-flop 454. The Q output of the flip-flop 454 is coupled to connection 237b, which forwards the modified phase compensation value Φ to the corrector 243 and to the data store 155. The modified phase compensation value Φ is generated as indicated in Equation 13 below.

$$\Phi = \Phi - \varphi$$ Equation 13

The modified gain compensation value Γ is a function of the initial gain compensation value and the estimate of the gain imbalance γ. The calibration data or a previously stored gain compensation value from data store 155 is received at a first input of the multiplier 456 via connection 237a. The connection 229 applies the estimate of the gain imbalance γ to a second input of the multiplier 456. The multiplier 456 provides the product of the initial gain compensation value and the estimate of the gain imbalance γ to a first input of the multiplexer 458. A second input of the multiplexer 458 is coupled to connection 355a, which provides one of the calibration data or a previously stored gain compensation value from the data store 155 to the second input of the multiplexer 458. The output of the multiplexer 458 is coupled to the data input of the flip-flop 460. The Q output of the flip-flop 460 is coupled to connection 237a, which forwards the modified gain compensation value Γ to the corrector 243 and to the data store 155. The modified gain compensation value Γ is generated as indicated in Equation 14 below.

$$\Gamma = \Gamma \cdot \gamma$$ Equation 14

In an example embodiment, the initial gain compensation value may be set to 0 dB and the initial phase compensation value may be set to 0 degrees. A modified gain compensation value Γ replaces the initial gain compensation value and a modified phase compensation value Φ replaces the initial phase compensation value. Both the modified phase compensation value Φ and the modified gain compensation value Γ are forwarded to data store 155 via multiple channel connection 237 where the values are retained for future use or adjustment as required.

The corrector 243 is arranged to receive the modified phase compensation value and the modified gain compensation value from the adjuster 241 and a select signal via connection 367 from the controller 300. In turn, the corrector 243 adds the modified phase compensation value (i.e., a portion of the quadrature signal) to the in-phase signal. In addition, the corrector applies the modified gain compensation value to one of the in-phase signal path on connection 252 or the quadrature signal path on connection 254.

The corrector 243 receives the I_IN signal via connection 202, which is coupled to a first input of the adder 472. The corrector 243 further receives the Q_IN signal via connection 204, which is coupled to a first input of the multiplier 470, a second input of the multiplexer 474 and a first input of the multiplexer 484. The modified phase compensation value Φ on connection 237b is applied to a second input of the multiplier 470. In turn, the multiplier 470 generates the product of Q_IN and the modified phase compensation value on connection 471, which is coupled to a second input of the adder 472. Accordingly, the adder 472 generates the sum of I_IN and the product of Q_IN and the modified phase compensation value on connection 473. The connection 473 is coupled to a second input of the multiplexer 482 and a first input of the multiplexer 474. In accordance with the control signal on connection 367, the multiplexer 474 forwards one of Q_IN or the phase adjusted I_IN signal on connection 475 to a first input of the multiplier 480. The modified gain compensation value T on connection 237a is applied to a second input of the multiplier 480. In turn, the multiplier 480 generates the product of the modified gain compensation value and one of the phase adjusted I_IN signal or the Q_IN signal and applies the same via connection 481 to a first input of the multiplexer 482 and a second input of the multiplexer 484. As further indicated in FIG. 4C, the multiplexer 482 forwards the adjusted I_OUT signal on connection 252, while the multiplexer 484 forwards the adjusted Q_OUT signal on connection 254.

Figure 5:
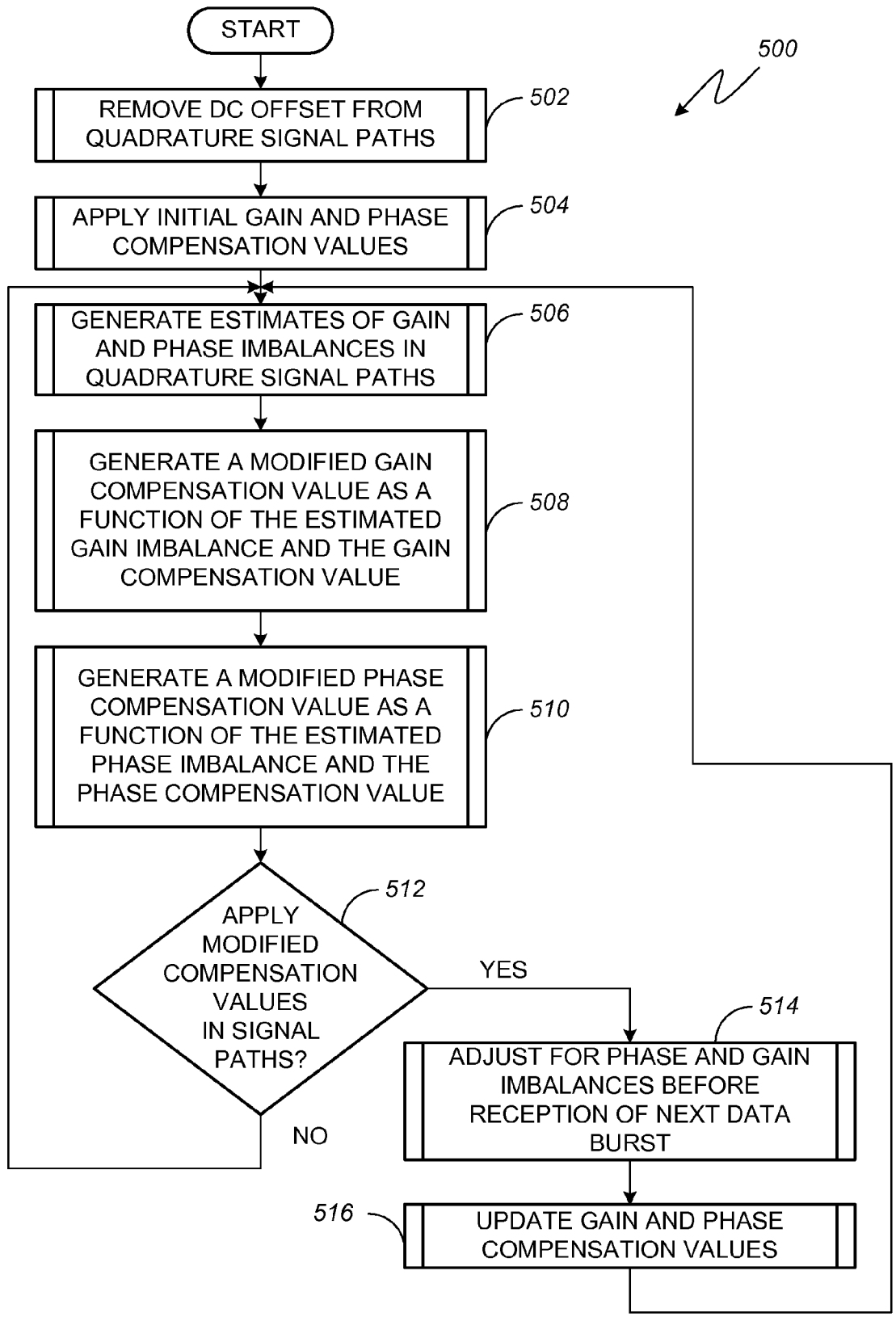
FIG. 5 is a flow chart illustrating an embodiment of a method for dynamic and selective estimation and cancellation of gain and phase imbalances in quadrature paths of a receiver.

FIG. 5 is a flow chart illustrating an embodiment of a method 500 for dynamic and selective estimation and cancellation of gain and phase imbalances in quadrature paths of a receiver. The flow diagram of FIG. 5 shows the architecture, functionality, and operation of a possible implementation via software and or firmware associated with a controller and a circuit in a signal processor. In this regard, each block represents a module, segment, or portion of code, which comprises one or more executable instructions for implementing the specified function(s). When the circuit 200 or the controller 300 are implemented via hardware, hardware and firmware or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 500 begins with block 502 where any DC offset present in quadrature signal paths is removed. As shown in block 504, a controller coupled to a memory applies an initial gain compensation value and an initial phase compensation value. As explained above, the initial gain compensation value and the initial phase compensation value can be derived from a receiver calibration. Otherwise, an initial gain compensation value and an initial phase compensation value can be determined under the assumption that an initial gain imbalance is 0 dB and an initial phase imbalance is 0 degrees until new estimates of the gain imbalance and the phase imbalance are available. In block 506, the signal processor generates an estimate of the gain imbalance and an estimate of the phase imbalance between the quadrature signal paths. Thereafter, the signal processor generates a modified gain compensation value as a function of the estimate of the gain imbalance and the gain compensation value, as indicated in block 508. In block 510, the signal processor generates a modified phase compensation value as a function of the estimate of the phase imbalance and the phase compensation value.

Figure 7:
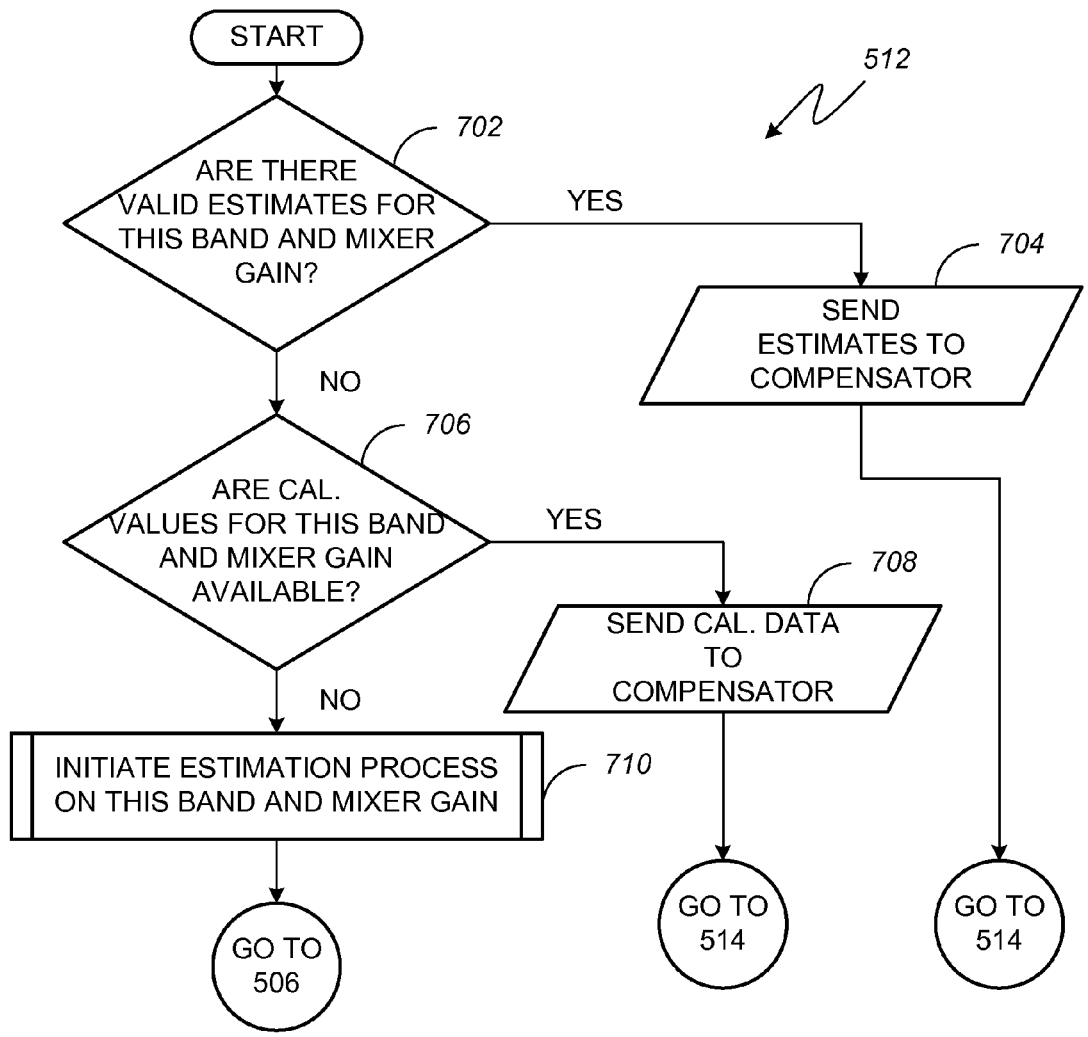
FIG. 7 is a flow chart illustrating an embodiment of a method for determining when to apply the estimates of the gain and phase imbalances in quadrature paths of a receiver.

In decision block 512, the signal processor makes a determination whether to apply the modified gain compensation and the modified phase compensation values in the quadrature signal paths of the receiver. An embodiment of the process for making such a determination is illustrated in FIG. 7, which will be explained in detail below. When it is determined not to apply the estimated gain imbalance and the estimated phase imbalance, as indicated by the flow control arrow labeled "NO," processing continues with block 506. Otherwise, when it is determined to apply the estimated gain imbalance and the estimated phase imbalance, as indicated by the flow control arrow labeled "YES," processing continues with block 514 where a compensator adjusts the signals in the I and Q signal paths of the receiver before reception of the next data burst. Thereafter, in block 516, the gain and phase compensation values are updated before returning to block 506.

Figure 6:
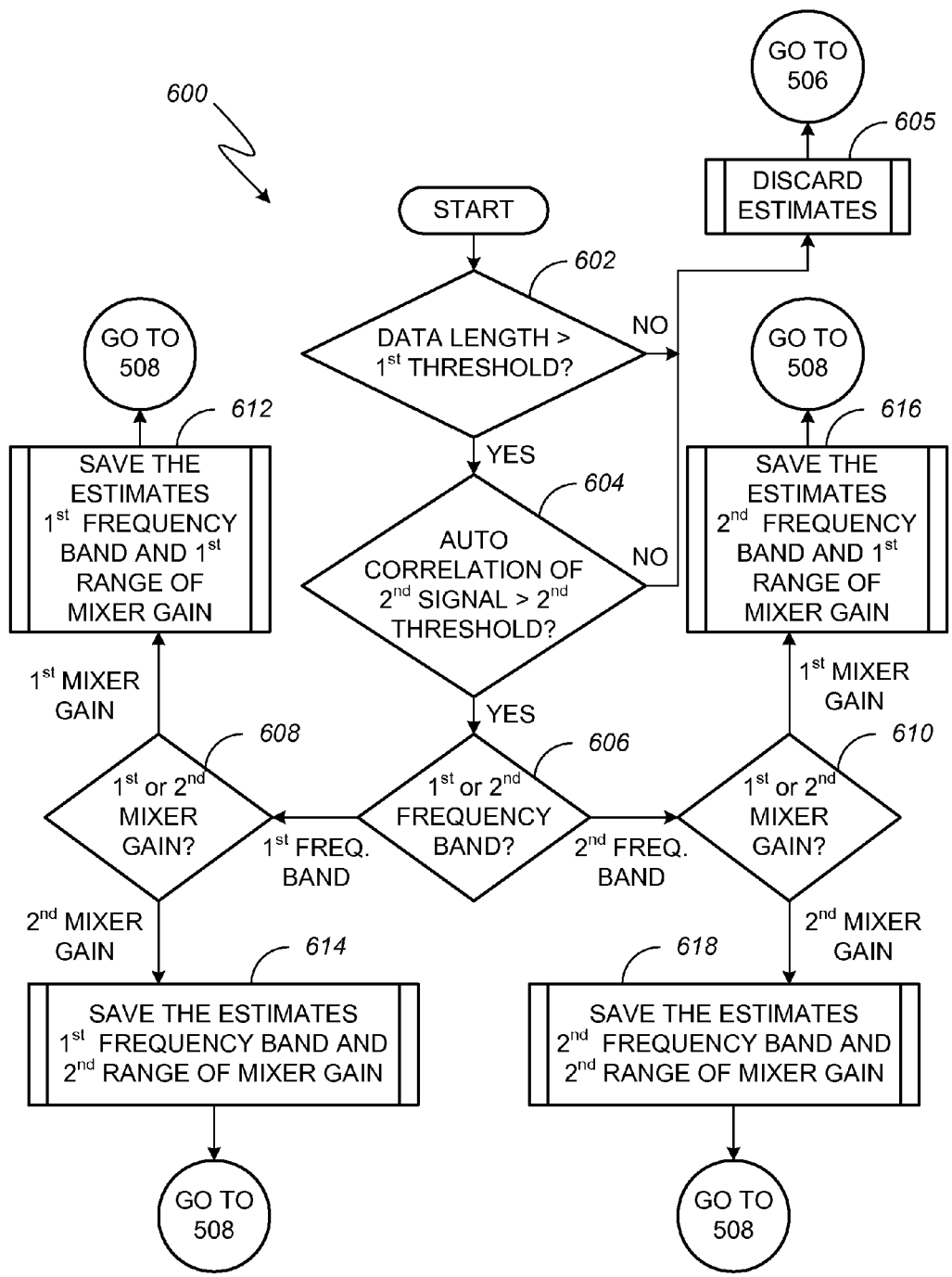
FIG. 6 is a flow chart illustrating an embodiment of a method for validating estimates of gain and phase imbalances in quadrature paths of a receiver.

FIG. 6 is a flow chart illustrating an embodiment of a method 600 for validating estimates of gain and phase imbalances in quadrature paths of a receiver. The flow diagram of FIG. 6 shows the architecture, functionality, and operation of a possible implementation via software and or firmware associated with a controller and a circuit in a signal processor. In this regard, each block represents a module, segment, or portion of code, which comprises one or more executable instructions for implementing the specified function(s). When the circuit 200 or the controller 300 are implemented via hardware, hardware and firmware or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 600 begins with decision block 602 where a determination is made as to whether the length of received data has reached a first threshold value. Since the monitor slot in a standard GSM frame typically uses fewer samples than in a data slot, the controller discards estimates that are obtained from fewer samples then a predetermined number of samples. Consequently, when the length of received data has not reached the first threshold, the estimate of the gain imbalance and the estimate of the phase imbalance are discarded, as indicated in block 605. When estimates are discarded, processing returns to block 506 (FIG. 5). Otherwise, when the length of received data has reached the first threshold, the estimates of the phase imbalance and the gain imbalance are retained and the validation process continues.

In decision block 604, a determination is made as to whether a value representing the autocorrelation of the second signal exceeds a second threshold value. When the value representing the autocorrelation of the second signal fails to exceed the second threshold value, the estimate of the gain imbalance and the estimate of the phase imbalance are discarded, as indicated in block 605. Otherwise, when the value representing the autocorrelation of the second signal exceeds the second threshold the estimates of the phase imbalance and the gain imbalance are retained and the validation process continues.

Thereafter, in decision block 606, a determination is made as to what frequency band the receiver is presently using. When it is determined that the receiver is operating in a first frequency band or first range of frequencies, processing continues with decision block 608. Otherwise, when it is determined that the receiver is operating in a second frequency band or second range of frequencies, processing continues with decision block 610.

In decision block 608, a determination is made as to what range of mixer gain the receiver is presently using. When it is determined that the receiver is operating in a first range of mixer gain, the estimate of the gain imbalance and the estimate of the phase imbalance for the first range of frequencies and a first range of mixer gain are saved, as indicated in block 612 and processing returns to block 508 (FIG. 5). Otherwise, when it is determined that the receiver is operating in a second range of mixer gain, the estimate of the gain imbalance and the estimate of the phase imbalance for the first range of frequencies and a second range of mixer gain are saved, as indicated in block 614 and processing returns to block 508 (FIG. 5).

In decision block 610, a determination is made as to what range of mixer gain the receiver is presently using. When it is determined that the receiver is operating in a first range of mixer gain, the estimate of the gain imbalance and the estimate of the phase imbalance for the second range of frequencies and a first range of mixer gain are saved, as indicated in block 616 and processing returns to block 508 (FIG. 5). Otherwise, when it is determined that the receiver is operating in a second range of mixer gain, the estimate of the gain imbalance and the estimate of the phase imbalance for the second range of frequencies and a second range of mixer gain are saved, as indicated in block 618 and processing returns to block 508 (FIG. 5).

Although the embodiment illustrated in FIG. 6 saves the estimates for the gain imbalance and the phase imbalance for two frequency bands and two ranges of mixer gain, it should be understood that the estimates for gain and phase imbalances can be indexed or otherwise stored in an arrangement such that the estimates are associated with any number of additional frequencies or frequency bands and any number of additional ranges of mixer gains.

FIG. 7 is a flow chart illustrating an embodiment of a method for determining when to apply the estimates of the gain and phase imbalances in quadrature paths of a receiver. The flow diagram of FIG. 7 shows the architecture, functionality, and operation of a possible implementation via software and or firmware associated with a controller and a circuit in a signal processor. In this regard, each block represents a module, segment, or portion of code, which comprises one or more executable instructions for implementing the specified function(s). When the circuit 200 or the controller 300 are implemented via hardware, hardware and firmware or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 512 begins with decision block 702 where it is determined if valid estimates for phase and gain imbalances exist for the present frequency band and range of mixer gain. When valid estimates exist, the controller sends the appropriate estimates to the compensator for application in the I and Q signal paths of the receiver, as indicated in input/output block 704. Otherwise, when valid estimates do not exist, processing continues with decision block 706, where it is determined if calibration data is available for the present frequency band and range of mixer gain. When calibration data exists, the controller sends the appropriate calibration data to the compensator for application in the I and Q signal paths of the receiver, as indicated in input/output block 708. When estimates or calibration data is sent to the compensator, processing continues with block 514 (FIG. 5). Otherwise, when calibration data does not exist for the present frequency band and range of mixer gain, processing continues with block 710, where an estimator is initiated to generate estimates for the present frequency band and range of mixer gain. Thereafter, processing continues with block 506 (FIG. 5). a determination is made as to whether valid estimates While various embodiments of the controller, circuit and methods for phase and gain imbalance in quadrature signal paths of a receiver have been described, it will be apparent to those of ordinary skill in the art that many more embodiments and implementations are possible that are within the scope of this disclosure. Accordingly, the controller, circuit and methods are not to be restricted except in light of the attached claims and their equivalents.

What is claimed is:

1. A method for dynamic estimation and cancellation of phase and gain imbalance in quadrature signal paths of a receiver, comprising:
  removing any DC offset present in the quadrature signal paths;
  applying an initial gain compensation value and an initial phase compensation value;
  generating an estimate of gain imbalance and an estimate of phase imbalance present between the quadrature signal paths
  comprises:
    determining when a data length reaches a first threshold value;
    determining when the auto correlation of the second signal exceeds a second threshold value;
    determining a present frequency band of operation;
    determining a present range of mixer gain; and
    saving the estimate of the gain imbalance and the estimate of the phase imbalance such that the presence of the estimate of the gain imbalance and the estimate of the phase imbalance can be confirmed and the estimate of the phase imbalance and the estimate of the gain imbalance retrieved responsive to the frequency band and the range of mixer gain;
  generating a modified gain compensation value as a function of the estimate of the gain imbalance and the initial gain compensation value;
  generating a modified phase compensation value as a function of the estimate of the phase imbalance and the initial phase compensation value; and
  making a determination whether to apply the modified gain compensation and the modified phase compensation values in the quadrature signal paths of the receiver.

2. The method of claim 1, wherein generating an estimate of the gain imbalance comprises computing an auto correlation of a first signal in the I signal path, an auto correlation of a second signal in the Q signal path and a cross correlation of the first and second signals in the quadrature signal paths.

3. The method of claim 2, wherein generating an estimate of the phase imbalance further comprises computing a ratio of the cross correlation of the first and second signals in the quadrature signal paths to the auto correlation of the second signal in the Q signal path.

4. The method of claim 2, wherein generating an estimate of the gain imbalance further comprises computing a ratio of the auto correlation of the first signal in the I signal path to the auto correlation of the second signal in the Q signal path.

5. The method of claim 1, further comprising:
  repeating the generating of an estimate of gain imbalance and an estimate of phase imbalance, the generating of a modified gain compensation value, the generating of a modified phase compensation value and making a determination whether to apply the modified gain compensation value and the modified phase compensation value for a predetermined time.

6. The method of claim 1, further comprising:
  applying the modified gain compensation value and the modified phase compensation value prior to a reception of a subsequent data burst.

7. The method of claim 1, wherein when a determination has been made to apply the gain compensation value and the phase compensation value, further comprising:
   determining which of the I signal path and the Q signal path should be gain adjusted.

8. The method of claim 1, wherein making a determination whether to apply the modified gain compensation and the modified phase compensation values in the quadrature signal paths of the receiver comprises:

determining when the estimate of the gain imbalance and the estimate of the phase imbalance exist for the frequency band and the range of mixer gain and applying the same; and otherwise, determining when calibration data exists for the frequency band and the range of mixer gain and applying the same.

* * * * *